United States Patent [19]

Verret et al.

[11] Patent Number: 5,089,428
[45] Date of Patent: Feb. 18, 1992

[54] METHOD FOR FORMING A GERMANIUM LAYER AND A HETEROJUNCTION BIPOLAR TRANSISTOR

[75] Inventors: Douglas P. Verret, Sugar Land; Kenneth E. Bean, Celina, both of Tex.

[73] Assignee: Texas Instruments Incorporated, Dallas, Tex.

[21] Appl. No.: 457,673

[22] Filed: Dec. 27, 1989

[51] Int. Cl.$^5$ .................. H01L 21/20; H01L 21/328
[52] U.S. Cl. .......................... 437/31; 437/32; 437/131; 437/234; 437/239; 148/DIG. 11; 148/DIG. 59
[58] Field of Search ............. 437/234, 238, 239, 240, 437/126, 131, 132, 31, 32, 33; 148/DIG. 58, DIG. 59, DIG. 11; 357/16

[56] References Cited

U.S. PATENT DOCUMENTS

| | | | |
|---|---|---|---|
| 3,725,161 | 4/1973 | Kuper | 437/131 |
| 4,891,329 | 1/1990 | Reisman et al. | 437/61 |
| 4,920,076 | 4/1990 | Holland et al. | 437/238 |
| 4,975,387 | 12/1990 | Prokes et al. | 437/131 |

FOREIGN PATENT DOCUMENTS

| | | |
|---|---|---|
| 61-59836 | 3/1986 | Japan . |
| 62-18719 | 1/1987 | Japan . |
| 62-43163 | 2/1987 | Japan . |
| 62-136036 | 6/1987 | Japan . |

Primary Examiner—Brian E. Hearn
Assistant Examiner—T. N. Quach
Attorney, Agent, or Firm—B. Peter Barndt; James T. Comfort; Melvin Sharp

[57] ABSTRACT

A method for preparing a germanium layer (22) adjacent to a germanium silicon layer (20). Initially, a P-germanium silicon layer (16) is deposited on to an N-germanium silicon layer (14). The continuous germanium layer (22) is formed by heating the layers (14 and 16) in a steam oxidation step to approximately 1000 degrees Centigrade to transform the P-germanium silicon layer (16) into the P-germanium layer (18) and a SiO$_2$ layer (22). A method for forming a heterojunction bipolar transistor utilizing a P-germanium layer (50) is also disclosed.

30 Claims, 3 Drawing Sheets

METHOD FOR FORMING A GERMANIUM LAYER AND A HETEROJUNCTION BIPOLAR TRANSISTOR

TECHNICAL FIELD OF THE INVENTION

This invention relates in general to a method of forming an integrated circuit device, and more particularly to a method for forming a germanium layer and a heterojunction bipolar transistor formed therefrom.

BACKGROUND OF THE INVENTION

As minimum dimensions continue to shrink in the fabrication of digital integrated circuits, corresponding improvements in the unity gain threshold frequency ($f_t$), maximum oscillation frequency ($f_{max}$), and propagation delay ($\tau_{pd}$) of transistors are increasingly difficult to realize. This is so because in general the parasitic elements associated with the transistors do not scale in proportion to the minimum dimensions. That is, two and three dimensional effects begin to become dominant.

In the case of the bipolar junction transistor (BJT), key parasitics which must be minimized to improve switching speed are base width, base resistance and base-collector capacitance. The minimization of these parasitics, unfortunately, tend to have a deleterious effect on the common emitter forward current gain ($h_{fe}$) and the collector to emitter breakdown voltage ($BV_{CEO}$) As the base width, for example, is made more narrow, the base doping must be increased in order to maintain $BV_{CEO}$. This reduces the time the device can be exposed to high temperatures during subsequent processing as well as degrading $h_{fe}$. A practical BJT, therefore, is fundamentally limited to an $f_t$ of about 20-30 GHz. This limit is set by the fact that when the base doping reaches the $10^{18}/cm^3$ regime, trap-assisted tunnelling in the base seriously degrades $h_{fe}$. The integrated base charge, on the other hand, which is required to maintain $BV_{CEO}$ at about 3-5 V then prevents the base width from being narrowed any further for a practical device.

To achieve further improvements in speed, the use of the heterojunction bipolar transistor (HBT) has been proposed The $h_{fe}$ of the HBT is not strongly dependent upon the respective base and emitter dopings, but rather by the difference in band widths (the band gap) between the emitter and base. The most common HBT's are fabricated using the III-V semiconductor compounds such as, for example, GaAs and AlGaAs. These, on the other hand, have not achieved the integration levels of silicon (Si) devices and are further limited by wafer diameter, material strength, substrate cost and a relatively high level of intrinsic defects.

Recently, HBT's have been fabricated using a Si emitter and a pseudomorphic $Ge_xSi_{1-x}$ strained-layer base. The presence of germanium (Ge) in the base reduces the band-gap in proportion to the amount of Ge present. Devices of 40 GHz $f_t$ have been fabricated with devices capable of 60 GHz $f_t$ predicted. The current gain of most HBT devices can in principle be maintained with high base doping and, therefore, comparatively small base resistance. The latter improves $f_{max}$ and delays the onset of emitter de-biasing. Further, because current crowding in the emitter is reduced, the device may be able to sustain higher currents before base conductivity modulation and the Kirk Effect manifest themselves.

The $Ge_xSi_{1-x}$ base HBT is subject to a physical limitation because the covalent radius of Ge is larger than that of Si. A small lattice mismatch, therefore, exists between the two layers at each $Si-Ge_xSi_{1-x}$ interface. For a thin enough film of $Ge_xSi_{1-x}$ on a Si substrate the mismatch is accommodated by a compressive stress in the $Ge_xSi_{1-x}$ film. When the thickness exceeds a critical thickness, a high density of the misfit dislocations appear at the interface along with threading dislocations which extend from the interface to the surface. These dislocations will give rise to junction leakage particularly when decorated with heavy metal contaminants. Once misfit dislocations appear, the $Ge_xSi_{1-x}$ layer becomes nearly strain free since the stress is relieved by the plastic deformation at the interface. The critical thickness for the onset of misfit dislocations is inversely proportional to the concentration of Ge in the film. When using pure Ge the thickness of the film which can be achieved on a Si substrate before plastic deformation occurs is on the order of 1-3 nm. Thus, the realization of a pure Ge base on a Si collector has not been possible in the past.

Therefore, a need has arisen for a process for manufacturing a substantially pure and narrow epitaxial Ge base in a Si-based HBT. Such a layer is needed to continue to improve the switching speed bipolar transistors.

SUMMARY OF THE INVENTION

The present invention provides a method for forming a continuous germanium layer in integrated circuits. One aspect of the present invention is a method for forming a germanium layer to be used as a base in a heterojunction bipolar transistor (HBT). In accordance with the present invention, a germanium layer is grown by a solid phase epitaxial process to form a continuous layer of germanium (Ge). An $N-Ge_xSi_{1-x}$ layer is deposited approximately one micron thick on an N-Silicon (Si) substrate. Subsequently, a $P-Ge_xSi_{1-x}$ layer is deposited onto the $N-Ge_xSi_{1-x}$.

The substrate, having layers formed thereon, is heated to approximately 1000 degrees Centigrade (°C.) in an oxidizing ambient which causes the P-germanium silicon layer to transform into a pure germanium layer. This occurs because the formation of $SiO_2$ essentially excludes Ge from the film. Thus, the Si is consumed leaving the Ge behind in the substrate. The residual Ge is left in the familiar diamond crystal structure and is therefore epitaxial to the substrate, though in a state of compressive stress. To alleviate the stress, the N-silicon substrate has an $N-Ge_xSi_{1-x}$ layer attached thereupon. Likewise, the $N-Ge_xSi_{1-x}$ layer has the newly formed P-Ge layer attached thereto for overcoming dislocation and interfacial lattice stress associated with the different lattice constants.

The basic concept is that the critical thickness which can be achieved before the elastic limit is exceeded depends upon the magnitude of the lattice mismatch. The lattice mismatch in turn is determined by the relative amounts of Ge present in the two films. The $N-Ge_xSi_{1-x}$ is purposefully grown thick enough to become discommensurate with the N-Si substrate. It is therefore strain free, but has a lattice constant which is closer to that of Ge than to Si. The P-Ge layer that is formed atop this layer can be thicker than it could otherwise be if grown atop a Si substrate. Accordingly, the P-Ge film can be grown thicker than 1-3 nm before becoming discommensurate. The n-$Ge_xSi_{1-x}$ film acts as a buffer layer between the P-Ge layer and the N-Si substrate. In accordance with the present invention, a device can be formed having a P-Ge base as the heterojunction bipolar junction transistor. In one embodiment, 2300 angstroms of P-$Ge_xSi_{1-x}$ is deposited to form a final base with of approximately 750 angstroms.

The present invention permits conventional CVD expitaxial growth techniques to be used which are very much more cost-effective than MBE and MOCVD techniques and permit larger diameter wafers to be used. The present device structure permits pure Ge base layers to be fabricated in a practical manner.

BRIEF DESCRIPTION OF THE DRAWINGS

Other aspects of the invention and their advantages will be appreciated with reference to the following detailed description taken in conjunction with the appended drawings in which.

DETAILED DESCRIPTION OF THE INVENTION

In accordance with the present invention, a germanium layer is formed which can act as a base in a heterojunction bipolar transistor (HBT).

Figure 1:
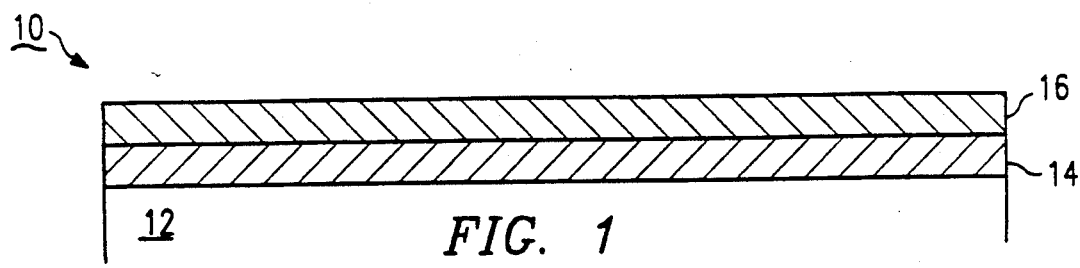
FIG. 1 is an enlarged cross-sectional view of a workpiece used to form an integrated structure of the present invention.

FIG. 1 is an enlarged cross-sectional view of a workpiece, generally designated 10. Workpiece 10 comprises an N-substrate 12 made of silicon. Additionally, workpiece 10 comprises an N-germanium silicon layer 14 formed on substrate 12 by chemical vapor deposition. Formed onto layer 14 is a P-germanium silicon layer 16. In accordance with the present invention, layers 14 and 16, may be deposited to a desired thickness, depending on the proposed application for workpiece 10.

Figure 2:
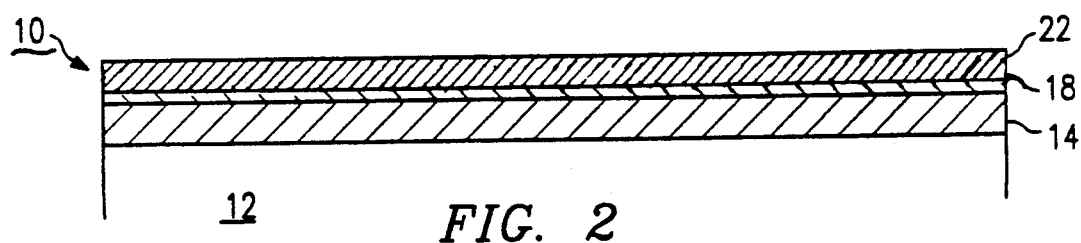
FIG. 2 is an enlarged cross-sectional view of the workpiece following the steam oxidation step used for forming a continuous germanium layer.

Referring to FIG. 2, a novel feature of the present invention is illustrated. If the temperature of workpiece 10 is increased to approximately 1000 degrees Centigrade (°C.) in an oxidizing ambient, layer 16 in FIG. 1 is transformed to a P-germanium layer 18 and a $SiO_2$ layer 22. The thickness of formed layer 18 is directly proportional to the time workpiece 10 is exposed to the high temperature. It has been observed that P-germanium silicon layer 16 structurally transforms into pure germanium layer 18. Film 14 is grown thick enough to cause dislocations at the interface between layer 14 and layer 12.

There is a high density of dislocations between layer 12 and layer 14 after growth of layer 14. In addition a few dislocations thread upward through layers 14 and 16 to the surface. In order for the HBT to be useful, there must be little to no dislocations in layers 14 and 18. This can happen if all dislocations can be confined to the interface between layers 12 and 14. A suitable choice of deposition temperature can make this possible.

The strain caused by the mismatch between the germanium layer and germanium silicon layer can cause elastic deformation if the change is excessive. If these dislocations can be confined to the plane of the junction, the device will function because the junctions are away from the plane.

Figure 3:
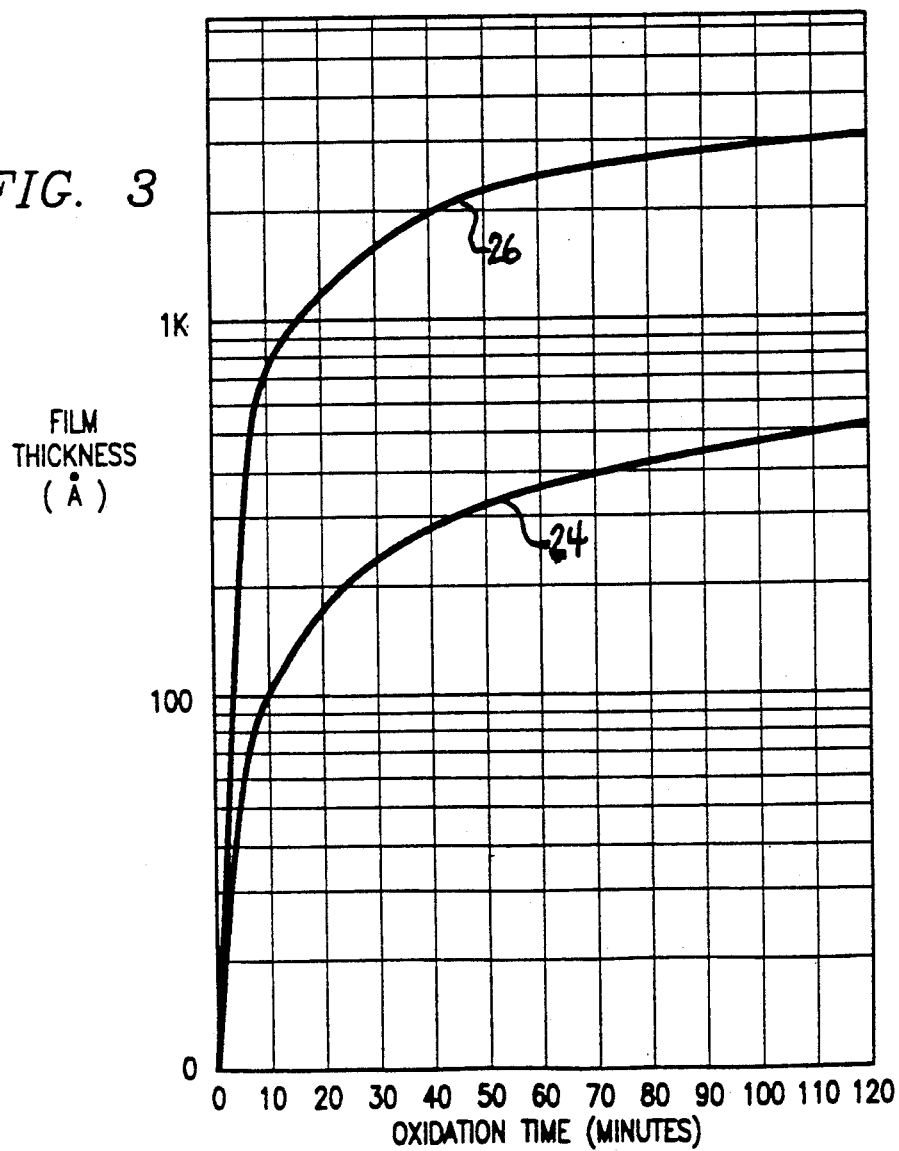
FIG. 3 is a graph illustrating the relationship between the thickness of $SiO_2$ grown on the N-germanium silicon layer and the formed pure germanium layer.

Referring to FIG. 3, a graph illustrating the growth rate of layers 18 and 22 during the temperature excursion can be seen. A line 24 depicts the growth rate of germanium layer 18 during the oxidation process, while the temperature of workpiece 10 is increased. A line 26 depicts the growth rate of layer 22 during the oxidation process. As can be seen, the growth rates of germanium layer 18 and layer 22 are proportional to the time of oxidation. Accordingly, the thickness of layers 22 and 18 can be accurately and predictably controlled to create a desired workpiece 10.

Referring to FIGS. 4 through 9, the processing steps to form a germanium base for a HBT 100 of the present invention are illustrated. Germanium layer 18 in FIG. 2 is formed having a thickness of approximately 750 angstroms by initially depositing N-$Ge_xSi_{1-x}$ layer 14 in FIG. 4 onto an silicon N-substrate 12. Layer 14 is deposited by CVD to approximately 1 micron to function as the buffer layer for device 100. P-$Ge_xSi_{1-x}$ layer 16 is deposited by CVD onto layer 14 in order to act as the future base of device 100. In its preferred embodiment, P-$Ge_xSi_{1-x}$ layer 16 has a thickness of approximately 2300 angstroms to eventually form P-germanium layer 18 of FIG. 2 having a thickness of approximately 750 angstroms. In an alternative embodiment, P-germanium silicon layer 16 has a thickness of approximately 1500 angstroms to eventually form P-germanium layer 18 having a thickness of approximately 500 angstroms. In fabrication, germanium silicon layer 16 may have a dopant such as boron deposited therein to create varied resistivities of manufactured germanium layer 18.

A layer 19 is deposited by means of conventional LPCVD process. The method of depositing silicon oxide layer 19 is well known in the art. When depositing the oxide layer 19, the deposition temperature will be approximately 650 to 850 degrees Centigrade. Layer 19 is deposited to a thickness of approximately 1000 angstroms.

A photoresist 30 is selectively deposited onto oxide layer 19 to form an opening 32 for exposing oxide layer 19. A plurality of boron ions 34 are exposed by ion implantation to device 100 to form an exposed region 36. Exposed region 36 is subsequently used as the P+ region for device 100. After exposed region 36 has been formed, photoresist 30 is removed by an oxygen ashing method well known in the art. Photoresist 30 may be a Novolak TM composition.

Figure 4:
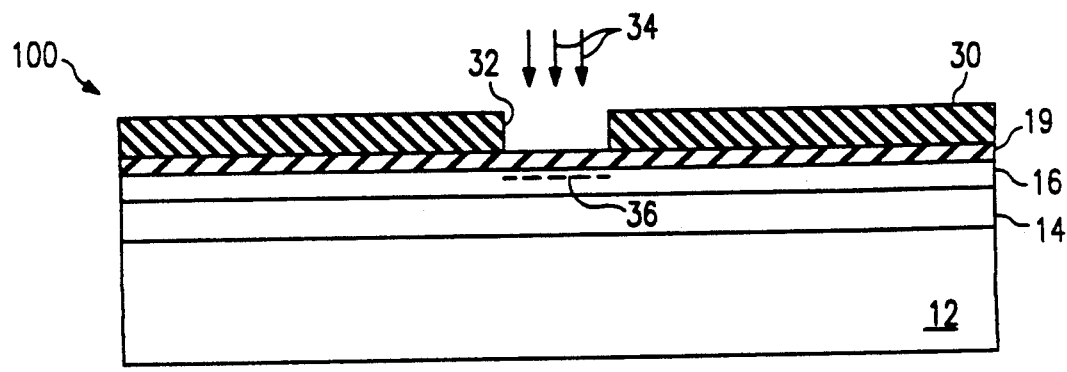
FIGS. 4-9 are successive schematic magnified cross-sectional views of an integrated circuit structure illustrating the fabrication of a HBT having a germanium base according to the present invention.
Figure 5:
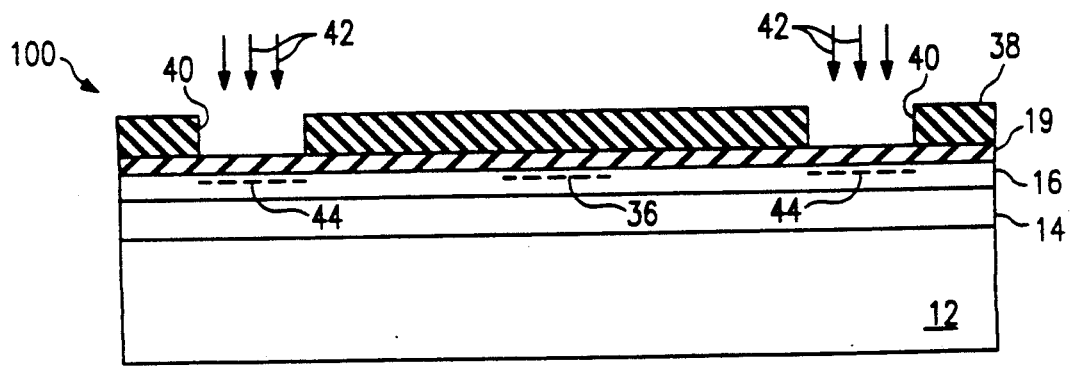

Referring now to FIG. 5, after photoresist 30 has been removed, pursuant to the process described in FIG. 4, a second photoresist 38 is deposited onto device 100. Photoresist 38 is selectively deposited onto oxide layer 19 preferably made of TEOS to expose openings 40 for subsequent processing. In accordance with the present invention, phosphorous dopant is used to perform an isolation implant to create N+ regions 44. Subsequently, photoresist 38 is removed and an HF-wet chemical etch is performed to remove layer 19 completely from device 100. If a plasma etch is used a fluoride etchant is utilized for removing layer 19 such as $CF_4$.

Figure 6:
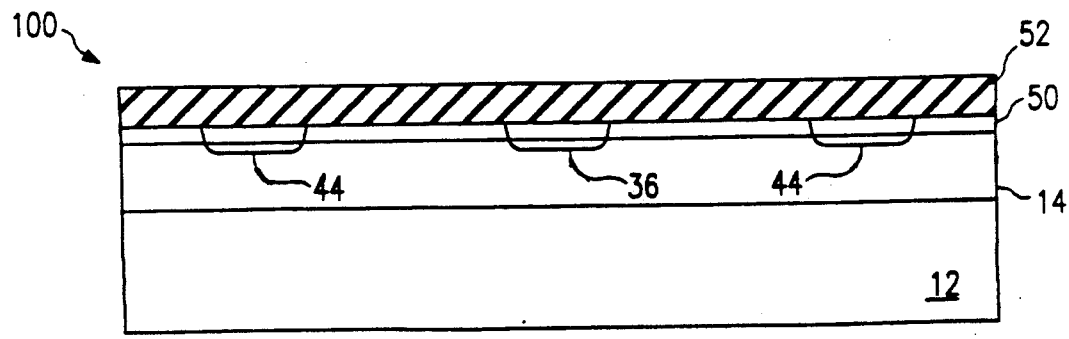

Referring now to FIG. 6, and in accordance with the present invention, device 100 is exposed to a steam oxidation process to increase the temperature of device 100 to approximately 1000 degrees Centigrade (°C.). If P-Ge$_x$Si$_{1-x}$ layer 16 is approximately 2300 angstroms thick, the oxidation will cause layer 16 to form a P-germanium crystalline layer 50 with a thickness of approximately 750 angstroms. Likewise, in its alternative embodiment, if P-Ge$_x$Si$_{1-x}$ layer 16 is approximately 1500 angstroms thick the resultant germanium layer 50 thickness will be approximately 500 angstroms thick. It should be understood that layer 50 is identical to layer 18 of FIG. 2.

In the process of growing oxide film 52, P-Ge$_x$Si$_{1-x}$ layer 16 converts to pure P-germanium layer 50. In accordance with the present invention, a silicon oxide 52 thermally grows on top of the germanium layer 50. Implants 42 and implant 34 become activated during the growth of film 52 forming isolation regions 44 and extrinsic base region 36, respectively.

Figure 7:
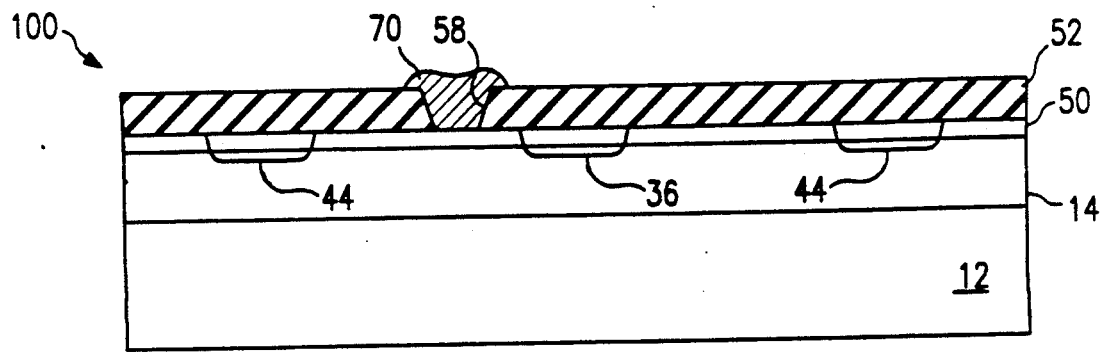

Referring to FIG. 7, a photoresist layer (not shown) is deposited, exposed and developed so as to expose region 58 in film 52. Region 58 of film is then etched clear of oxide by conventional oxide etching techniques exposing a portion of base region 50. An n-type in doped situ polysilicon film of 2500 Å thickness is deposited on film 52 after the photoresist is removed. Alternatively, n-type SiC may be used. This film is then patterned and etched leaving structure 70 to serve as the emitter electrode touching film 50 which is the intrinsic base.

Figure 8:
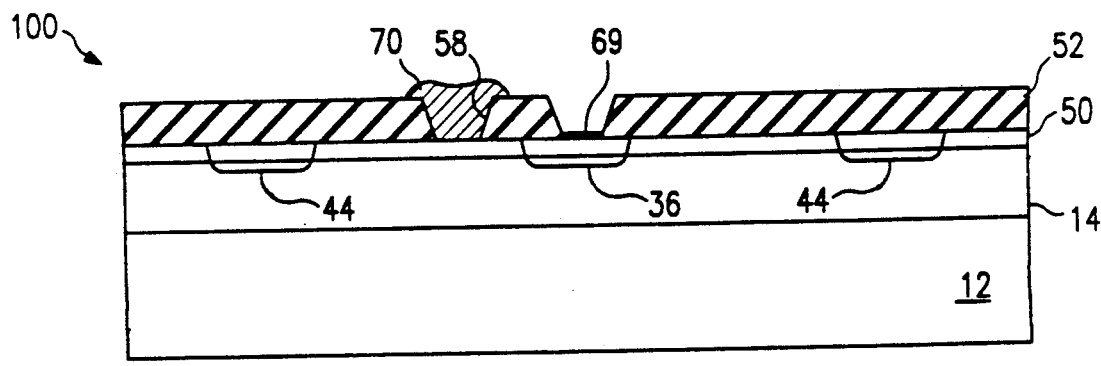

Referring to FIG. 8, another photoresist layer is deposited, exposed and developed so as to expose a region 69 over extrinsic base 36 of film 52. Oxide in the exposed region is etched away exposing region 36. The photoresist is stripped and a Pt film is sputter deposited and sintered at 450° C. in an inert ambient such as nitrogen. Wherever the Pt touches Si or polysilicon it is converted to PtSi. The wafer is then exposed to aqua regia whereupon all Pt is removed except where PtSi has formed. This assures good ohmic contact to the extrinsic base and emitter.

Figure 9:
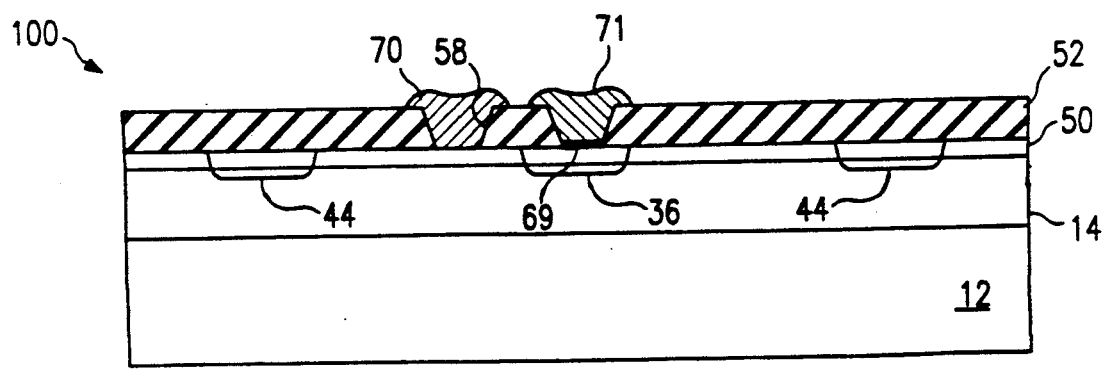

Referring to FIG. 9, an aluminum or aluminum alloy layer 71 is deposited, patterned and etched so as to make electrical contact to the emitter and base regions. The collector is contacted in this embodiment through the backside of the wafer. FIG. 9 depicts aluminum or aluminum alloy layer 71 interconnected to the extrinsic base region. The emitter 70 is contacted by the interconnect in a region out of the plane of this drawing.

It should be noted that the collector region can be electrically contacted from the topside by opening one portion of oxide region 52 over isolation region 44 at the same time that the P+ contact is opened. Subsequently, the contact can be silicided simultaneously with the emitter and extrinsic base. Later, a contact can be made at region 44 at the same time that it is made to the emitter and extrinsic base.

Alternatively, if another type of isolation is used such as dielectric or trench isolation, a topside collector contact may still be made by contacting an N+ region put into place specifically for that purpose and produced in identical manner as region 44 previously described.

In accordance with the present invention, a germanium based heterojunction bipolar transistor (HBT) has been formed. As part of the present invention, other devices may be formed which would utilize a germanium layer. In the prior art, the method of choice for fabricating HBT's of III-V compounds, compound semiconductors and some Si-Ge transistors has been by means of MBE or MOCVD. These processes are typically limited to wafers of 75 mm diameter or less and the throughput is very low, typically a few wafers per hour. In the more conventional approaches to fabricating Si-Ge transistors, the base width is determined by the difference in diffusion depths between an emitter and base diffusion. For base widths less than about 100 nm, it is very difficult to control this difference with any degree of precision. Thus, the variability of base widths within a wafer or from wafer to wafer or from batch to batch is typically been quite large. In the method of the present invention, the base width can be controlled very precisely. With reference to FIG. 3 when one controls the oxide thickness over a range of 20 nm, the Ge layer base is controlled within a range of about 2-3 nm. This allows for higher yields and lower cost.

Another advantage of the present invention is that substantially pure Ge base layers can be fabricated to thicknesses of several hundred angstroms without forming large densities of dislocations between it and the underlying film. This occurs because the Ge layer base is grown on a Ge$_x$Si$_{1-x}$ substrate rather than a pure Si substrate. Thus, the critical thickness for the onset of plastic deformation (dislocations) is larger.

In summary the present invention permits higher manufacturing throughput, better control of base width and provides a method for using a pure Ge base in a practical device.

While preferred embodiments have been detailed in the above-description, the invention is not limited hereto, but only by the spirit and the scope of the appended claims.

What is claimed is:

1. A process for forming a P-germanium layer on a layer of silicon:
   depositing a first N-germanium silicon layer on the silicon layer;
   depositing a P-germanium silicon layer on the first N-germanium silicon layer; and
   heating the wafer in an oxidizing ambient until said P-germanium silicon layer transforms into the P-germanium layer under a layer of formed silicon dioxide.

2. The process of claim 1, wherein the deposition of the first N-germanium silicon layer is by chemical vapor deposition.

3. The process of claim 1, where the deposition of the P-germanium silicon layer is by chemical vapor deposition.

4. The process of claim 1, wherein the deposition of the first N-germanium silicon is expitaxial to the silicon substrate.

5. The process of claim 1, wherein the deposition of the P-germanium silicon is expitaxial to said N-germanium silicon.

6. The process of claim 1, wherein the thickness of said N-germanium silicon layer is such that the lattice is relaxed and free from stress due to the formation of dislocations at its interface with the silicon substrate.

7. The process of claim 1, wherein the P-germanium silicon is in compressive stress and commensurate with said N-germanium silicon layer.

8. The process of claim 1, wherein said heating step comprises the step of steam oxidizing the wafer to approximately 1000 degrees Centigrade.

9. A process for forming a germanium layer on a wafer, comprising the steps of:

depositing a first layer of N-germanium silicon on said wafer;

depositing a second layer of P-germanium silicon on said first layer of N-germanium silicon; and oxidizing the wafer until the second layer of P-germanium silicon forms a separate layer of P-germanium.

10. The process of claim 9, wherein the step of depositing the second P-germanium silicon layer comprises the process of depositing the P-germanium silicon layer having a thickness of approximately 2300 angstroms.

11. The process of claim 10, wherein the forming of said P-germanium layer produces a layer having a thickness of approximately 750 angstroms.

12. The process of claim 9, further comprising the step of growing an N-germanium silicon layer on the wafer to approximately 1 micron before depositing said P-germanium silicon layer to the wafer.

13. The process of claim 9, further comprising the step of depositing tetraethylorthosilane (TEOS) to said P-germanium silicon layer to form an oxide layer.

14. The process of claim 13, further comprising the step of forming a photoresist pattern onto said oxide layer.

15. The process of claim 14, further comprising the step of implanting boron ions into the wafer.

16. The process of claim 15, further comprising the step of selectively stripping the photoresist from the wafer.

17. The process of claim 16, further comprising the step of implanting phosphorous dopant to create N+ isolation regions.

18. The process of claim 17, further comprising the step of stripping said TEOS layer from the wafer with hydrofluoric acid.

19. The process of claim 18, further comprising the step of growing an oxide film on said P-germanium silicon layer.

20. The process of claim 19, further comprising the step of exposing said P-germanium layer.

21. The process of claim 20, further comprising the step of depositing a first conducting layer to said exposed region.

22. The process of claim 21, further comprising the step of exposing the wafer having boron implanted therein.

23. The process of claim 22, further comprising the step of depositing a second conducting layer to said exposed wafer.

24. The process of claim 9, wherein the deposition of the first N-germanium silicon layer is by chemical vapor deposition.

25. The process of claim 9, wherein the deposition of the P-germanium silicon layer is by chemical vapor deposition.

26. The process of claim 9, wherein the deposition of the first N-germanium silicon is expitaxial to the wafer.

27. The process of claim 9, wherein the deposition of the P-germanium silicon is expitaxial to said N-germanium silicon.

28. The process of claim 9, wherein the thickness of said N-germanium silicon layer is such that the lattice is relaxed and free from stress due to the formation of dislocations at its interface with the wafer.

29. The process of claim 9, wherein the P-germanium silicon is in compressive stress and commensurate with said N-germanium silicon layer.

30. A process for forming a P-germanium base for use in a heterojunction bipolar transistor (HBT) on a wafer which comprises the steps of:

forming an N-germanium silicon buffer layer onto a silicon N-substrate;

depositing a first P-germanium silicon on said buffer layer;

depositing an oxide layer on said P-germanium silicon layer;

depositing a photoresist layer on said oxide layer;

selectively implanting boron into said deposited layers to form P+ contacts;

depositing a second photoresist layer;

implanting phosphorous to form N+ contacts;

selectively stripping said second photoresist and said oxide layer from said P-germanium silicon layer;

heating the wafer by steam oxidation to approximately 1000 degrees Centigrade to cause said P-germanium silicon layer to form a P-germanium layer selectively isolated from said N-germanium silicon layer, said heating forms a silicon dioxide layer on said P-germanium layer;

selectively depositing a third photoresist layer;

etching the wafer to form an exposed region;

depositing a conductive layer in said exposed region;

selectively etching the wafer to expose said P+ region;

depositing aluminum over the P+ region to form the transistor of the present invention.

* * * * *